United States Patent
Tang et al.

(10) Patent No.: US 11,528,029 B2
(45) Date of Patent: Dec. 13, 2022

(54) APPARATUS TO SYNCHRONIZE CLOCKS OF CONFIGURABLE INTEGRATED CIRCUIT DIES THROUGH AN INTERCONNECT BRIDGE

(71) Applicant: Intel Corporation, Santa Clara, CA (US)

(72) Inventors: Lai Guan Tang, Penang (MY); Ankireddy Nalamalpu, Portland, OR (US); Dheeraj Subbareddy, Portland, OR (US)

(73) Assignee: Intel Corporation, Santa Clara, CA (US)

(*) Notice: Subject to any disclaimer, the term of this patent is extended or adjusted under 35 U.S.C. 154(b) by 932 days.

(21) Appl. No.: 16/024,242

(22) Filed: Jun. 29, 2018

(65) Prior Publication Data
US 2019/0044520 A1 Feb. 7, 2019

(51) Int. Cl.
| | |
|---|---|
| *H03L 7/07* | (2006.01) |
| *H03L 7/087* | (2006.01) |
| *H03L 7/093* | (2006.01) |
| *G06F 1/12* | (2006.01) |
| *H01L 25/065* | (2006.01) |
| *H01L 23/538* | (2006.01) |
| *H03L 7/099* | (2006.01) |
| *H03L 7/06* | (2006.01) |
| *H03L 7/22* | (2006.01) |

(52) U.S. Cl.
CPC ................. *H03L 7/07* (2013.01); *G06F 1/12* (2013.01); *H01L 23/5381* (2013.01); *H01L 23/5385* (2013.01); *H01L 25/0655* (2013.01); *H03L 7/06* (2013.01); *H03L 7/087* (2013.01); *H03L 7/093* (2013.01); *H03L 7/099* (2013.01); *H03L 7/22* (2013.01)

(58) Field of Classification Search
CPC ... H03L 7/07; H03L 7/06; H03L 7/087; H03L 7/093; H03L 7/099; H03L 7/22; G06F 1/12; H01L 23/5381; H01L 23/5385; H01L 25/0655
See application file for complete search history.

(56) References Cited

U.S. PATENT DOCUMENTS

| | | | |
|---|---|---|---|
| 8,629,548 B1 * | 1/2014 | Andreev ............ | H03K 19/0016 257/691 |
| 8,677,306 B1 * | 3/2014 | Andreev ............... | G06F 11/267 714/39 |
| 9,543,965 B1 * | 1/2017 | Ding ........................ | H03L 7/04 |
| 10,333,535 B1 | 6/2019 | Mendel et al. | |

(Continued)

*Primary Examiner* — Adam D Houston

(57) ABSTRACT

An IC, operable at a first clock phase, includes first and second IOs and a PLL. The PLL includes a control circuit, an input to receive a first clock signal, an output to output a second clock signal, and a first detector to generate a first phase difference signal from the first and second clock signals. The IC includes a second phase detector that is coupled to the PLL's output to receive the second clock signal and is coupled to the first IO to receive a third clock single from a second IC, which is operable at a second clock phase. The second detector generates a second phase difference signal from the second and third clock signals. If the PLL uses the second phase difference signal to generate the second clock signal, then the second clock signal is synchronized with the third clock signal for synchronous data transfer.

20 Claims, 9 Drawing Sheets

(56) References Cited

U.S. PATENT DOCUMENTS

| | | | |
|---|---|---|---|
| 11,288,222 B1* | 3/2022 | Noguera Serra | G06F 13/1668 |
| 2007/0086268 A1* | 4/2007 | Shaetfer | G11C 7/1063 |
| | | | 365/233.1 |
| 2014/0028348 A1* | 1/2014 | Andreev | H03K 19/0948 |
| | | | 716/105 |
| 2014/0103959 A1* | 4/2014 | Andreev | G06F 30/327 |
| | | | 716/105 |
| 2014/0105246 A1* | 4/2014 | Andreev | G01K 7/01 |
| | | | 374/178 |
| 2016/0020759 A1* | 1/2016 | Bryan | G11C 7/22 |
| | | | 327/293 |
| 2016/0172017 A1* | 6/2016 | King | G11C 7/222 |
| | | | 365/189.11 |
| 2018/0233907 A1* | 8/2018 | Dubowski | H01L 27/0296 |
| 2018/0239738 A1* | 8/2018 | Teh | G06F 1/10 |
| 2019/0042505 A1* | 2/2019 | Subbareddy | G06F 13/14 |
| 2019/0044520 A1* | 2/2019 | Tang | H01L 25/0655 |
| 2019/0158096 A1* | 5/2019 | Tang | H01L 23/5382 |
| 2021/0376833 A1* | 12/2021 | Jennings | H03K 19/17728 |
| 2022/0138120 A1* | 5/2022 | Wang | G11C 16/32 |
| | | | 710/308 |

* cited by examiner

APPARATUS TO SYNCHRONIZE CLOCKS OF CONFIGURABLE INTEGRATED CIRCUIT DIES THROUGH AN INTERCONNECT BRIDGE

FIELD OF THE DISCLOSURE

The present disclosure relates to integrated circuit dies that are housed in a multi-chip package. More specifically, the present disclosure relates to a multi-chip package that houses dies that have different timing characteristics where the timing characteristics are detected by a phase detector and synchronized by a phase-locked loop.

BACKGROUND OF THE INVENTION

Integrated-circuit packaging has evolved from housing a single IC die in a package to housing and interconnecting a number of dies to form system-in-package (SiP) devices. SiP devices are often highly integrated semiconductors that may combine a number of IC dies of various functionalities, various processing generations, or various manufacturing processes, all within a single package. The IC dies combined in a SiP often form a system or subsystem for a device.

SiP devices not only reduce the footprint of IC dies housed in a single package as compared to discretely packaged ICs mounted on a printed circuit board (PCB) but also shorten the distances that electrical signals travel between IC dies housed by the SiP as compared to discretely packaged ICs mounted on a PCB.

Thereby, SiP devices may facilitate faster operations in a smaller footprint of a system or subsystem formed by the SiP device as compared to a system or subsystem of discretely packaged ICs mounted on a PCB. However, an impetus remains to continue to improve the operation of SiP devices and various embodiments described in this description are directed toward further improving the interoperability, flexibility, and the performance of the dies included SiP devices via a clock synchronization system.

DETAILED DESCRIPTION OF THE INVENTION

System-in-package (SiP) devices, such as SiP devices that provide system and subsystem architectures, continue to fuel development in integrated circuit (IC) markets. Circuit emulation markets, ASIC prototyping markets, and data center markets are a few of the developing IC markets fueled by SiP devices. SiP devices directed toward circuit emulation markets often include a number of configurable ICs to facilitate an almost unlimited number of emulated circuits where a single configurable circuit may be unable to supply sufficient programmable fabric for implementing a circuit emulation. SiP devices directed toward ASIC prototyping markets often include a number of configurable ICs to implement a variety of ASICs. SiP devices directed toward data center markets often include a number of configurable ICs to facilitate acceleration in the data center.

Figure 1:
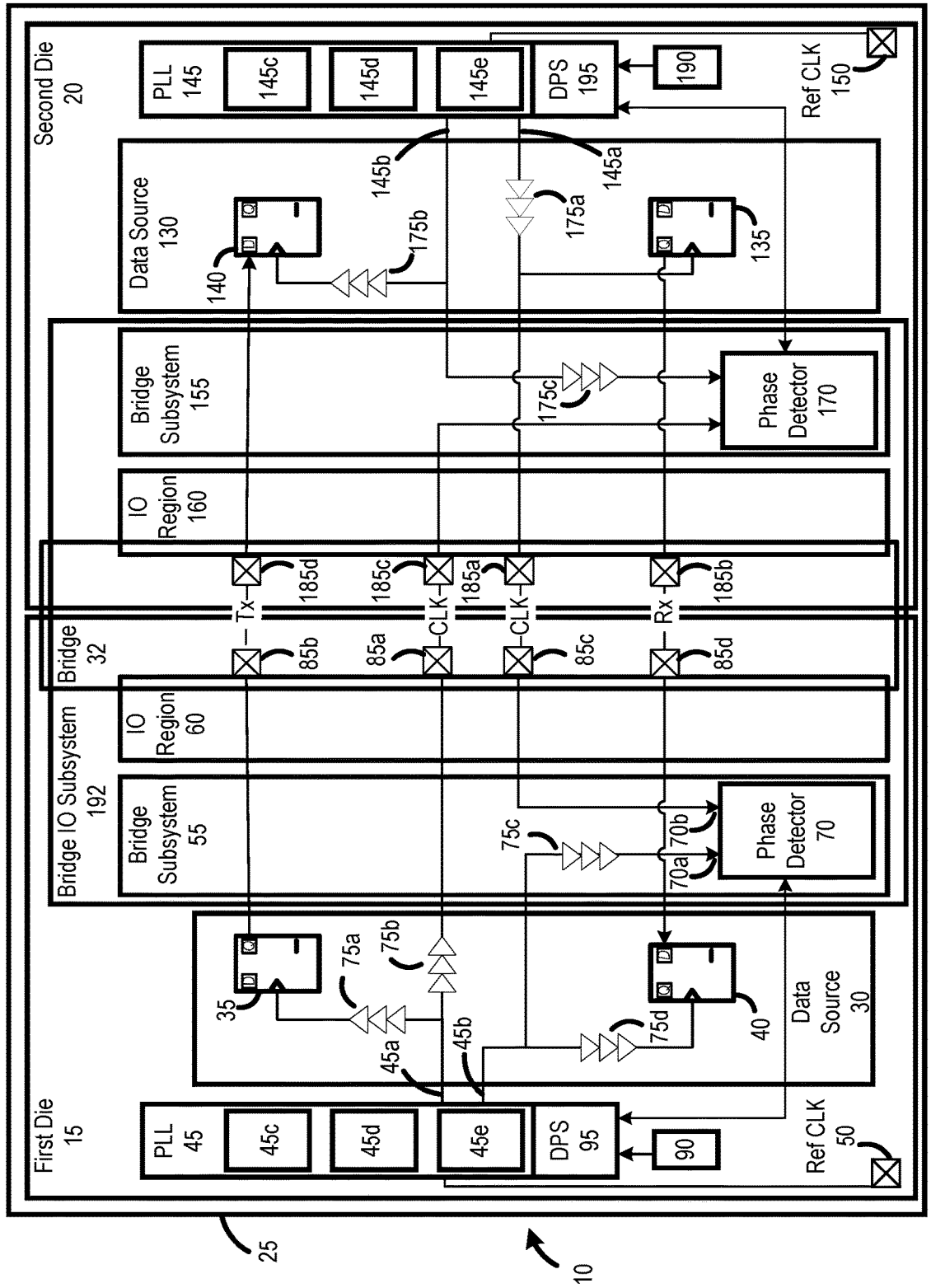
FIG. 1 illustrates a semiconductor device that includes first and second dies mounted on a package substrate, in an embodiment.

FIG. 1 illustrates a semiconductor device 10 that includes a first die 15 and a second die 20 mounted on a package substrate 25, in an embodiment. Semiconductor device 10 may be a SiP device and may include more than two dies in some embodiments.

The first and second dies may be connected by the package substrate, an interconnect bridge 32, or both. The package substrate, the interconnect bridge, or both may include conductive vias, electrical traces, or both that connect the electrical connectors of the first and second dies. The package substrate may be an organic substrate, such as FR4, FR5, FR6, or other types of material. FR4, FR5, and FR6 designate flame retardant levels for package substrates designated by Underwriters Laboratories of the United States under standard number UL 94 and by National Electrical Manufacturers Association (NEMA) of the United States.

The interconnect bridge may be an organic bridge, such as FR4, FR5, FR6, or others, a silicon interposer, a chip on wafer on substrate (CoWos), an embedded multi-die interconnect bridge (EMIB) element, or other bridge types. The interconnect bridge may be embedded in the package substrate, where the package substrate may be an organic substrate, such as FR4 and the bridge is an EMIB element.

The interconnect bridge may be a passive bridge that does not include electronic devices on the bridge or may be an active bridge that includes electronic devices on the bridge. For example, the interconnect bridge may be a silicon device with semiconductor circuits formed in the silicon.

The first die 15 and the second die 20 may be the same types of dies or may be different types of dies. The first die may be a configurable logic die, such as a field programmable gate array (FPGA), a programmable logic device (PLD), a complex programmable logic device (CPLD), an electrically programmable logic device (EPLD), an electrically erasable programmable logic device (EEPLD), a logic cell array (LCA), a programmable logic array (PLA), a configurable logic array (CLA), field programmable logic array (FPLA), or other ICs. The second die may be an FPGA, a PLD, a CPLD, an EPLD, an EEPLD, a LCA, an application-specific standard part (ASSP), a central processing unit (CPU), a microprocessor, a graphical processing unit (GPU), a digital signal processor (DSP), an application specific integrated circuit (ASIC), a vision processing unit (VPU), an image array processors (SIMD), a neural network processor, an artificial intelligence processor, a cryptographic accelerator, just to name a few.

The dies may have different timing characteristics. For example, the dies may have different processing characteristics that occur during wafer processing that result in the dies having different timing characteristics. Dies having different processing characteristics are sometimes described as originating from different processing corners. Different processing characteristics occur for a number of reasons, such as differences in humidity or temperature during wafer processing or transport, die size, the position of dies relative to the center of a wafer, or other reasons. Relatively large dies may exhibit a greater difference in processing characteristics than smaller dies.

The different timing characteristics may result in the dies operating at different clock phases or different clock frequencies. The dies may have different clock trees that take into account the different timing characteristics of the clock signals of the dies. For example, the different clock trees may cause the clock signals of first and second dies to be out of phase. The clock signals may be out of phase at the leaf nodes of the clock trees where the clock signals are used for clocking the circuits of the dies. Although clock trees facilitate the dies operating out of phase with each other, the phases of the clock signals in the different dies may be synchronized so that the dies are able to clock information between the dies. Clock synchronization is described further below.

In an embodiment, the first die includes a data source 30, a first transmitter 35, a first receiver 40, a clock generator 45, a clock input element 50, a bridge subsystem adaptor 55, an input (IO) region 60, a phase detector and sequencer 70, a number of clock tree buffer 75a, 75b, 75c, and 75d, and a number of IO elements 85a, 85b, 85c, and 85d. The second die includes a data source 130, a second transmitter 135, a second receiver 140, a clock generator 145, a clock input element 150, a bridge subsystem adaptor 155, an IO region 160, a phase detector and sequencer 170, one or more clock tree buffer 175a, 175b, and 175c, and a number of IO elements 185a, 185b, 185c, and 185d.

The IO elements 85a-85d of the first die 15 connect to the IO elements 185a-185d of the second die via package substrate 25, interconnect bridge 32, or both of these elements. The IO elements of the dies may connect with IO elements of the package substrate, the interconnect bridge, or both. The package substrate, the bridge, or both may include electrical traces, plated vias, or both that connect the IO elements of the first and second dies. The traces of the package substrate may be metal traces, such as copper traces. The traces of the interconnect bridge may be metal traces on a silicon substrate. IO elements 85a-85d and 185a-185d may include electrical connectors, such as solder bumps, solder balls, pins, solder pads, or other interconnect elements, which are sometimes referred to generally as bumps.

In an embodiment, the interconnect bridge 32 is an interposer. The interposer may be a silicon interposer for a 2D, 2.5D, or 3D IC package. The interposer may be an extended silicon interposer that extends under first and second dies 15 and 20 and may connect additional dies to die 15, 20, or both. For a 2D package, the bridge is interposed between the dies and may be a PCB 25 (e.g., FR4 PCB). The bridge for a 2D package is sometimes referred to as a SiP substrate where a first side of the bridge is connected to the dies via solder bumps of a first size (e.g., about 100 microns in diameter or other diameters) and a second side of the bridge is connected to the PCB by solder bumps of second larger size (e.g., larger diameter) than the first size. The smaller solder bumps are sometimes referred to as flip-chip bumps and the larger diameter solder bumps are sometimes referred to as package bumps. For a 2.5D package, the bridge is interposed between the dies and a SiP substrate where the bridge includes vias that connect the dies to the SiP substrate. The SiP substrate is in turn connected to the PCB 25 (e.g., FR4 PCB). A first side of a bridge for a 2.5D package is connected to the dies via relatively small solder bumps that are sometimes referred to as micro-bumps (e.g., about 10 microns in diameter or other diameters) and a second side of the bridge is connected to the SiP substrate by solder bumps of larger diameter, such as about 100 microns in diameter or other diameters.

In an embodiment, the first and second dies are both FPGAs. The data sources 30 and 130 are the core fabrics of the FPGAs. The core fabric of each die includes a number of configurable logic blocks that may be configured to implement various circuits. The configurable logic blocks are interconnected by configurable interconnect structures that may be configured to interconnect the logic blocks in almost any desired configuration to provide almost any desired circuit.

On the first die, the first transmitter 35 and the first receiver 40 are formed from the configurable logic blocks of the first core fabric 30. The first transmitter and first receiver may each be a flip flop (e.g., d flip flop) or another circuit. The clock tree buffers 75a-75d may also be formed from the configurable logic blocks. The clock generator 45 may be a first phase-locked loop (PLL). The first PLL may be formed from the configurable logic blocks of the first core fabric. Alternatively, the first PLL may be a hardened circuit that is not formed from the configurable logic blocks of the first die. Hardened circuits are formed in the silicon substrate and are not configurable by a hardware description language, unlike circuits formed in the configurable logic blocks that are configured using a hardware description language (e.g., VHDL). The first PLL includes a phase detector 45c, a loop filter 45d, and a controlled oscillator 45e.

On the second die, the second transmitter 135 and the second receiver 140 are formed from the configurable logic blocks of the second core fabric 130. The second transmitter and second receiver may each be a flip flop (e.g., d flip flop) or another circuit. The clock tree buffers 175a-175c may also be formed from the configurable logic blocks of the second die. The second PLL may be formed from the configurable logic blocks of the first core fabric. Alternatively, the second PLL may be a hardened circuit that is not formed from the configurable logic blocks of the second die. The second PLL includes a phase detector 145c, a loop filter 145d, and a controlled oscillator 145e.

In an embodiment, the first phase detector and sequencer 70 of the first die is a hardened circuit that is not formed from the configurable logic blocks of the die. The first phase detector and sequencer may be formed in the first bridge subsystem adapter 55 of the first die. The first bridge subsystem adapter 55 may be formed in a peripheral region (e.g., not in the core fabric) of the first die adjacent to the IO elements of the die.

In an embodiment, the second phase detector and sequencer 170 of the second die is a hardened circuit that is not formed from the configurable logic blocks of the die. The second phase detector and sequencer may be formed in the second bridge subsystem adapter 155 of the second die 20. The second bridge subsystem adapter 155 may be formed in a peripheral region (e.g., not in the core fabric) of the second die adjacent to the IO elements of the die.

The first and second bridge subsystem adapters may include circuits for controlling input, output, or both for the first and second dies. For example, the first and second bridge subsystem adapters may include various IO registers for clocking data out from and clocking data into the dies (e.g., registered output and input). The first and second bridge subsystem adapters may also include circuits for combinatorial output and input (e.g., non-clocked or non-registered input and output), IO buffers, IO control logic, one or more file layers for arranging data according to a protocol, such as the PCIe protocol, or other circuits.

The first PLL 45 is connected to clock input line 50 and is adapted to receive a reference clock signal via the clock input line. The reference clock signal may be a crystal clock signal or another clock signal. The first PLL is also connected to an output line of the phase detector and sequencer 70. The first PLL is adapted to receive phase information from the output line of the phase detector and sequencer 70. The phase information may be digital information that is transmitted in a digital signal. The first PLL may include a DPS controller 95 that is adapted to receive the phase difference signal from the phase detector and sequencer 70 where the phase difference signal includes the phase information. The phase information that is generated by the phase detector and sequencer 70 is described below.

A first clock output 45*a* of the first PLL is connected to a clock input of the first transmitter 35 and to the clock IO element 85*a*. A second clock output 45*b* of the first PLL is connected to a clock input of the first receiver 40 and to a clock input of the phase detector and sequencer 70. The first clock output 45*a* and second clock output 45*b* of the first PLL may output the same or different clock signals having the same or different clock frequencies or the same or different clock phases. In an embodiment, the first PLL may have a single clock output that connects to the inputs of the first transmitter 35, clock IO element 85*a*, first receiver 40, and phase detector and sequencer 70.

In an embodiment, the clock tree buffer 75*a* is connected between the first clock output 45*a* of the first PLL and the clock input of the first transmitter 35. The clock tree buffer 75*b* is connected between the first clock output 45*a* of the first PLL and the clock IO element 85*a*. The clock tree buffer 75*c* is connected between the second clock output 45*b* of the first PLL and a clock input of the phase detector and sequencer 70. The clock tree buffer 75*d* is connected between the second clock output 45*b* of the first PLL and the clock input of the first receiver 40.

The clock tree buffers 75*a*-75*d* may be portions of a clock tree scheme of the first die. The clock tree buffers may generate phase delays of the one or more clock signals generated by the first PLL. The phase delays generated by the clock tree buffers 75*a*-75*d* may be the same phase delay or one or more different phase delays. The clock tree buffers may establish different clocking domains in the first die when the clock tree buffers create different phase delays of the clock signal. For example, clock tree buffers 75*a* and 75*b* may create the same first phase delay creating a first clock domain. In the example, clock tree buffers 75*c* and 75*d* may create a second phase delay creating a second clock domain. If the first and second phase delays are different delays, the first and second clock domains are different clock domains. The described clock domains are example domains. The clock tree buffers may establish more or fewer clock domains in the first die.

In an embodiment, a data output line of the first transmitter 35 is connected to the transmitter IO element 85*b*. The clock input of the first transmitter 35 is adapted to receive a clock signal from the first clock output 45*a* of the first PLL for clocking the transmitter. Using the clock signal, the first transmitter 35 is adapted to clock data from the transmitter to the transmitter IO element 85*b*.

The phase detector and sequencer 70 is connected between the second output 45*b* of the first PLL 45 and an input of the DPS controller 95 of the first PLL 45. Specifically, an input of the phase detector and sequencer 70 is adapted to receive a clock signal generated by the first PLL. The clock signal may be received from the clock tree buffer 75*c*, which is positioned between the second PLL output 45*b* of PLL 45 and an input 70*a* of the phase detector and sequencer input 70. Phase information generated by the phase detector and sequencer 70 is fed back into the input of the DPS controller 95 of the first PLL 45. The phase information that is generated by the phase detector and sequencer 70 is described below.

A data input of the first receiver 40 is connected to the receiver IO element 85*d*. The clock input of the first receiver 40 connected to the second output 45*b* of first PLL is adapted to receive a clock signal from the output. Using the clock signal, the first receiver 40 is adapted to clock data received from the receiver IO element 85*d* to a data output of the first receiver. That is, the first receiver 40 is adapted to use the clock signal to clock data into the first die.

In an embodiment, the second PLL 145 is connected to clock input line 150 and is adapted to receive a reference clock signal via the clock input line. The reference clock signal may be the crystal clock signal or another clock signal. The reference clock signals received by the first and second PLLs may be the same reference clock signals or may be different clock signals having different frequencies or different phase. The second PLL is also connected to an output line of the phase detector and sequencer 170. The second PLL is adapted to receive phase information from the output line of the phase detector and sequencer. The second PLL may include a DPS controller 195 that is adapted to receive the digital signal from the phase detector and sequencer 70.

A first clock output 145*a* of the second PLL is connected to a clock input of the second transmitter 135 and to the clock IO element 185*a*. A second clock output 145*b* of the second PLL is connected to a clock input of the second receiver 140 and to a clock input of the phase detector and sequencer 170. The first clock output 145*a* and second clock output 145*b* of the second PLL may output the same or different clock signals having the same or different clock frequencies or the same or different clock phases. In an embodiment, the second PLL may have a single clock output that connects to the second transmitter 135, clock IO element 185*a*, second receiver 140, and phase detector and sequencer 170.

In an embodiment, the clock tree buffer 175*a* is connected between the first clock output 145*a* of the second PLL and the clock input of the second transmitter 135. The clock tree buffer 175*a* is also connected between the first clock output 145*a* of the second PLL and the clock IO element 185*a*. The clock tree buffer 175*b* is connected between the second clock output 145*b* of the second PLL and a clock input of the second receiver 140. The clock tree buffer 175*c* is connected between the second clock output 145*b* of the second PLL and a clock input of the phase detector and sequencer 170.

The clock tree buffers 175*a*-175*c* may be portions of a clock tree scheme of the second die. The clock tree buffers 175*a*-175*c* may generate a phase delay of the one or more clock signals generated by the second PLL. The phase delays generated by the clock tree buffers 175*a*-175*c* may be the same phase delay or one or more different phase delays. The clock tree buffers may establish different clocking domains in the second die when the clock tree buffers create different phase delays of the clock signal generated by the second PLL. For example, clock tree buffers 175*a* and 175*b* may create the same first phase delay creating a first clock domain. In the example, clock tree buffer 175*c* may create a second phase delay creating a second clock domain. The first and second phase delays generated by the clock tree buffers are different delays if different clock domains are generated. The described clock domains are example domains. The clock tree buffers may establish more or fewer clock domains in the second die.

The nodes of the clock trees that are at the outputs of the clock tree buffers are referred to as the leaf nodes of the clock trees. The nodes of the clock trees that are at the inputs of the clock tree buffers are referred to as the branch nodes of the clock trees.

In an embodiment, a data output of the second transmitter 135 is connected to the receiver IO element 185b. The clock input of the second transmitter 135 is connected to the first output 145a of the second PLL. The clock input of the second transmitter 135 is adapted to receive a clock signal from the first output 145a of the second PLL for clocking the transmitter. Using the clock signal, the second transmitter is adapted to clock data from the transmitter to the receiver IO element 185b.

The phase detector and sequencer 170 is connected between the second output 145b of the second PLL 145 and an input of the DPS controller 195 of the second PLL 145. Specifically, an input of the phase detector and sequencer 170 is adapted to receive a clock signal generated by the second PLL. The clock signal may be received from the clock tree buffer 175c, which is positioned between the first PLL output 145b of PLL 145 and an input 170a of the phase detector and sequencer 170. Phase information generated by the phase detector and sequencer 170 is fed back into the input of the DPS controller 195 of the second PLL 145. The phase information that is generated by the phase detector and sequencer 170 is described below.

A data input of the second receiver 140 is connected to the transmitter IO element 185d. The clock input of the second receiver 140 is connected to the second output 145b of second PLL is adapted to receive a clock signal from the output. Using the clock signal, the second receiver 140 is adapted to clock data received from the receiver IO element 185d to a data output of the second receiver. That is, the second receiver 140 is adapted to use the clock signal to clock data into the second die.

In an embodiment, the first and second bridge subsystem adapters 55 and 155, the first and second IO regions 60 and 160, and the interconnect bridge 32 compose at least a portion a bridge IO subsystem 192 of semiconductor device 10. The bridge IO subsystem 192 and the elements forming the subsystem are not included (i.e., formed) in the core fabric of either the first die 15 or the second die 20. The bridge IO subsystem 192 is a region of the semiconductor device where signals are transmitted between the first and second dies.

In the bridge IO subsystem 192, transmitter IO elements 85b and 185d are connected, clock IO elements 85a and 185c are connected, clock IO elements 85c and 185a are connected, and receiver IO elements 85d and 185b are connected. More specifically, the connected IO elements (e.g., solder bumps of the dies) connect via traces formed in the interconnect bridge 32, such as traces formed in an EMIB element. Signals may be transmitted from transmitter 35 to receiver 140 through IO elements 85b and 185d. Signals may be transmitted from PLL 45 to phase detector and sequence 170 through IO elements 85a and 185c. Signals may be transmitted from PLL 145 to input 70b of phase detector and sequence 70 through IO elements 185a and 85c. Signals may be transmitted from transmitter 135 to receiver 40 through IO elements 185b and 85d.

Figure 2:
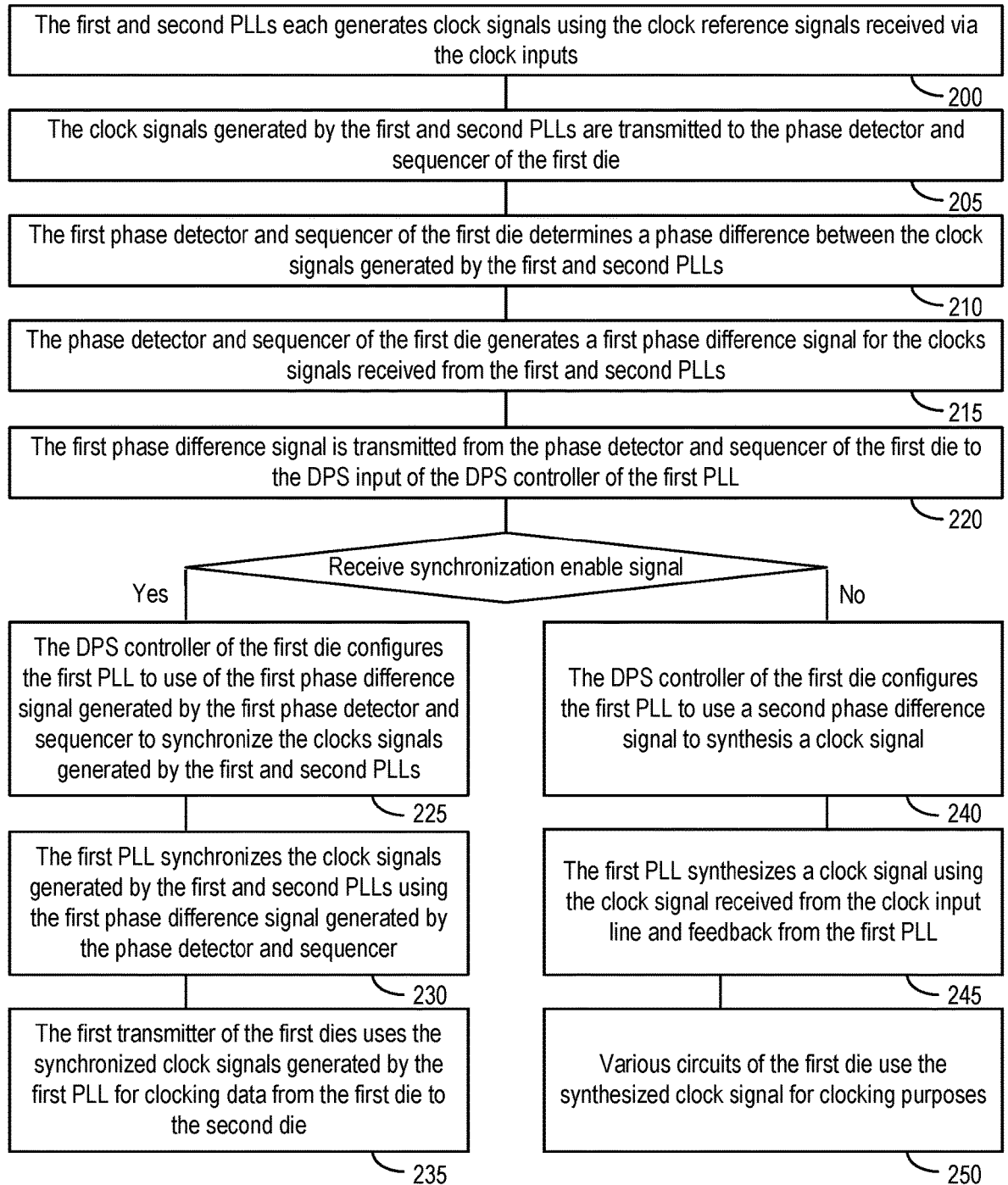
FIG. 2 is a flow diagram for a clock synchronization method, in an embodiment.

FIG. 2 is a flow diagram for a clock synchronization method, in an embodiment. Elements may be added to the flow diagram, removed from the flow diagram, or combined without deviating from the scope and purview of the method.

At 200, the first PLL 45 and the second PLL 145 each generates clock signals using the clock reference signals received via clock inputs 50 and 150, respectively. The clock signals generated in the first die by the first PLL 45 may be transmitted in through the clock tree buffer 75a to the first transmitter 35, through the clock tree buffer 75c to the phase detector and sequencer 70, and through the clock tree buffer 75d to the first receiver 40.

The clock signals are also transmitted through the clock tree buffer 75b in the first die 15 to the phase detector and sequencer 170 in the second die 20. The clock signals transmitted from the first die to the second die are transmitted through the clock IO element 85a in the first die to the clock IO element 185c in the second die. Additionally, the clock signals transmitted from the first die 15 to the second die 20 are transmitted from the leaf node of the clock tree buffer 75b to the second die. The leaf nodes of the clock tree buffers are on the output sides of the clock tree buffers and on the sides of the clock tree buffers where the clock signals are used for clocking circuits in the dies.

The clock signals generated in the second die 20 by the second PLL 145 may be transmitted through the clock tree buffer 175a to the second transmitter 135, through the clock tree buffer 175c to the phase detector and sequencer 170, and through the clock tree buffer 175b to the second receiver 140.

At 205, the clock signals generated by the second PLL 145 are also transmitted through the clock tree buffer 175a in the second die 20 to the phase detector and sequencer 70 in the first die 15. The clock signals transmitted from the second PLL to the phase detector and sequencer 70 are transmitted through the clock IO elements 185a in the second die to the clock IO element 85c in the first die. The clock signals transmitted from the second die 20 to the phase detector and sequencer 70 in the first die are transmitted from the leaf node of the clock tree buffer 175a to the first die.

To synchronously clock data out of one die (e.g., the first die) to the other die (e.g., the second die), the clock signal from the leaf nodes are synchronized. Synchronization may include frequency synchronization or phase alignment. Synchronization is described below.

As described briefly above, the clock signals that are generated by the first and second PLLs are transmitted to both of the phase detector and sequencers 70 and 170. At 210, the first phase detector and sequencer 70 determines a phase difference between the clock signals generated by the first and second PLLs.

At 215, the phase detector and sequencer 70 generates a first phase difference signal based on the clocks signals received from the first and second PLLs. The first phase difference signal indicates a difference in the phase between the clocks signals received from the first and second PLLs by the phase detector and sequencer 70. The phase difference signal may be a counter signal that is generated by the phase detector and sequencer. The value of the counter signal may indicate the amount of temporal difference between the edges (e.g., rising edges) of the first and second clock signals generated by the first and second PLLs.

At 220, the first phase difference signal is transmitted from the phase detector and sequencer 70 to the input of the DPS controller 95 of the first PLL 45.

At 225, if the DPS controller 95 of the first PLL 45 receives a synchronization enable signal, then the DPS controller 95 configures the first PLL to use the first phase difference signal generated by the first phase detector and sequencer 70 to synchronize the clocks signals that are generated by the first PLL 45 and the second PLL 145.

At 230, the first PLL synchronizes the clock signals using the first phase difference signal generated by the phase detector and sequencer 70. Specifically, the clock edges of the clock signals generated by the first PLL 45 are adjusted to align with the clock edges (e.g., rising edges) of the clock signals generated by the second PLL 145. The clock edges of the clock signals generated by the second PLL 145 may not be adjusted. More specifically, filter 45d may filter (e.g., a digital filter) the first phase difference signal and provide a filtered signal to the controlled oscillator 45d. The controlled oscillator may then adjust the phase of the clock signals generated by the first PLL. The phase detector 45c of the first PLL may not be used when the clock signals are synchronized by the first PLL. That is, the phase detector and sequencer 70 operates as the first PLL's phase detector.

The DPS controller may include one or more circuits that allow the first PLL to use the first phase difference signal for clock synchronization. The DPS controller may include one or more switches, a multiplexer, or another circuit that allows the first PLL to use the first phase difference signal rather than a second phase difference signal generated by the phase detector 45c. The second phase difference signal is described below.

At 235, one or more transmitters (e.g., transmitter 35) of the first die 15 may use the synchronized clock signal generated by the first PLL to clock data from the first die to the second die. One or more receivers (e.g., receiver 40) of the first die may also use the synchronized clock signal to clock data into the first die that is received from the second die.

At 240, if the first PLL does not receive the synchronization enable signal, then the DPS controller configures the first PLL to use a second phase difference signal to synthesize a clock signal. The second phase difference signal may be generated by the phase detector 45c of the first PLL. The phase detector 45c may generate the second phase difference signal that is used by the first PLL's filter 45d and controlled oscillator 45e to synthesize the synthesized clock signal. Circuits of the DPS controller may allow the first PLL to use the second phase difference signal for clock synthesis rather than using the first phase difference signal for clock synchronization of the clock signals generated by the first and second PLLs.

At 245, the first PLL synthesizes a clock signal using the second phase difference signal generated by the phase detector 45c. The first PLL may also use the clock signal (e.g., crystal clock signal) received from clock input 50 and feedback from one of the clock outputs of the first PLL to generate the synthesized clock signal. The second phase difference signal may be used by the first PLL's filter 45d to control the controlled oscillator 45e to generate the synthesized clock signal.

In an embodiment, the synchronization enable signal may be generated by a phase selector 90, the phase detector and sequencer 70, or another circuit. The synchronization enable signal may be applied to the first PLL if data is to be synchronously transmitted from the first die and to the second die, received by the first die from the second die, or both. The phase selector 90 may be hardened circuit or may be formed in the core fabric of the first die.

At 250, one or more circuits may use the synthesized clock signal generated by the first PLL for clocking the various circuits of the first die.

In one embodiment, the phase detector and sequencer 70 relatively continuously determines the phase difference between the clock signals generated by the first and second PLLs and generates the first phase difference signal. Relatively continuous determination of the phase difference facilitates a relatively fast switch from the clock synthesis by the first PLL to the clock synchronization mode of the first PLL. The relatively fast switch between the modes occurs because the phase detector and sequencer 70 does not have to receive and use a control signal to initiate the clock comparison and generate the phase difference information for the clocks. That is, the phase difference information is determined on an ongoing basis and is ready for use by the first PLL when the PLL is selected for clock synchronization.

In an alternative embodiment, the phase detector and sequencer 70 determines the phase difference between the clock signals generated by the first and second PLLs and generate the first phase difference signal after the phase detector and sequencer 70 receives an enable signal. That is, in the alternative embodiment, the phase detector and sequencer 70 does not relatively continuously determine the phase difference between the clock signals generated by the first and second PLLS and does not generate the first phase difference signal unless the enable signal is applied. The power consumption of the SiP may be lowered if the phase detector and sequencer is not in relatively continuous operation.

In an embodiment, the phase detector and sequencer 170 and the second PLL 145 of the second die 20 is configured to operate similarly to phase detector and sequencer 70 and the first PLL 45 of the first die 215 at 200-250 of FIG. 2 and as described above. That is, the phase detector and sequencer 170 of the second die 20 may determine a phase difference between the clock signals generated by the first and second PLLs, generate a phase difference signal (e.g., a counter signal generated by the phase detector and sequencer 170) that the second PLL uses to synchronize the clock signals generated by the second PLL to the clock signal generated by the first PLL 45. That is, the second PLL uses the phase difference signal to align (e.g., align the clock edges) the clock signals generated by the second PLL to the clock signals generated by the first PLL. The second PLL is configured to synchronize the clock signals if the second PLL is configured by the DPS controller 195 for clock synchronization (e.g., 225-230 of FIG. 2). Alternatively, the second PLL will be configured to synthesize the clock signals if the second PLL is configured by the DPS controller 195 for clock synthesis (e.g., 240-245 of FIG. 2) and not for clock synchronization (225-230).

The first and second PLLs may not be configured by their respective DPS controller to simultaneously attempt to synchronize the clock signals generated by the first and second PLLs. That is, the first PLL or the second PLL, but not both, at any given time may receive a synchronization enable signal for synchronizing clock signals generated by the first and second PLLs. Clock instabilities may be avoided by not allowing both the first and second PLLs to simultaneously attempt to synchronize the clock signals generated by the first and second PLLs.

Figure 3:
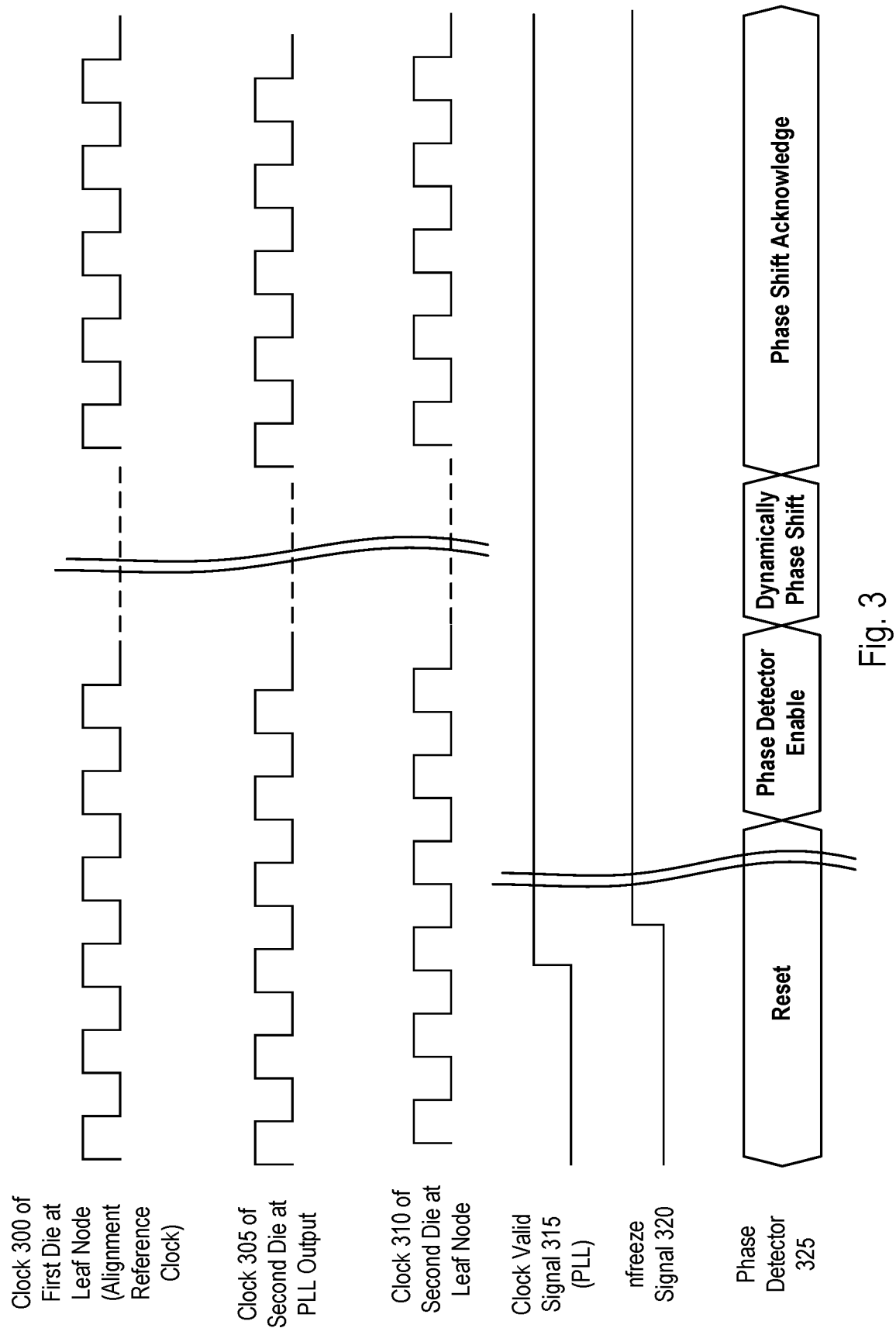
FIG. 3 is a timing diagram of clock signals generated by first and second dies being synchronized, in an embodiment.

FIG. 3 is a timing diagram of clock signals generated by the second die 20 being synchronized to clock signals generated by the first die 15, in an embodiment. The timing diagram includes a first clock signal 300 and a second clock signal 305. The timing diagram includes control signals that include a clock validate signal 315, an nfreeze signal 320, and various states 325 of the phase detector and sequencer.

While the timing diagram is described as including clock signals generated by the second die 20 being synchronized to clock signals generated by the first die 15 (e.g., the second clock signals are shifted to align with the clock signals of the first die where the clock signals of the first die are not shifted), in an embodiment, the timing diagram may equally apply to clock signals generated by the first die 15 being synchronized to clock signals generated by the second die 20.

The first clock signal 300 is the clock signal at the output (i.e., leaf node) of a clock tree buffer, such as clock tree buffer 75*b*. That is, the first clock signal 300 is the clock signal that is generated and output (e.g., output 45*a*) by the first PLL 45 in the first die 15 after transmission through the clock tree buffer 75*b*. The second clock signal 305 is the clock signal that is generated and output (e.g., output 145*a*) by the second PLL 145.

The third clock signal 310 is the clock signal at one of the leaf nodes of the second die 20. For example, the third clock signal 310 may be at the leaf nodes of one of the clock tree buffers 175*a*, 175*b*, 175*c*, or combinations of these depending on whether any of the leaf nodes are in the same time domain. Clock signals 300 and 310 are synchronized in the second die 20 in the example embodiment of FIG. 3.

The clock validate signal 315 is a signal that indicates that the clock signal generated by the second PLL 145 is valid. The clock valid signal 315 may be generated by the second PLL 145 and transmitted from the PLL to the phase detection and sequencer 170 or another circuit prior to clock synchronization being performed. Phase detection and clock synchronization may begin after the clock valid signal is received.

The nfreeze signal 320 is a signal that indicates that data from the data source (e.g., data from an FPGA's core fabric) has been released from the source, such as being gated to one or more registers. The nfreeze signal may be transferred from one or more circuits of the data source to the phase detector and sequencer or other circuits. Phase detection and clock synchronization may begin after the nfreeze signal is received. The nfreeze signal 320 may be issued after the clock valid signal 315.

The reset signal is a signal that is transferred to the phase detector and sequencer 170 prior to clock synchronization. The reset signal signals the phase detector and sequencer to enter a known state. For example, after the phase detector and sequencer receives the reset signal, the phase detector and sequencer may enter zeros in various registers of the phase detector and sequencer. The reset signal may be received from outside of the second die via one of the general purpose IOs of the second die. Alternatively, the reset signal may be generated by the data source (e.g., core fabric of an FPGA) and transmitted to the phase detector and sequencer. Alternatively, the reset signal may be generated by a firmware or software initiated reset register bit and transmitted to the phase detector and sequencer. The reset signal may be transferred to the phase detector and sequencer prior to clock synchronization being performed. The reset signal may also be transferred to the phase detector and sequencer prior to the clock valid signal and the nfreeze signal being transferred to the phase detector and sequencer.

The phase detector enable signal is a signal that is transferred to the phase detector and sequencer for the phase detector and sequencer to initiate clock synchronization. Thereafter, the phase detector and sequencer 170 and the second PLL 145 of the second die 20 may dynamically phase shift (i.e., synchronize) the clock signal generated by the second PLL to align the edges of the clock signal with the edges of the clock signal generated by the first PLL 45 of the first die 15. During dynamic phase shifting the second PLL uses the phase shift signal provided by the phase detector and sequencer to synchronize the first and second clock signal.

Note that on the left side of FIG. 3, prior to the phase detector enable signal being received by the phase detector and sequencer and prior to dynamic phase shift occurring, the clock signals 300 and 310 are out of phase (i.e., not synchronized). Note that on the right side of FIG. 3, subsequent to dynamic phase shifting, the clock signals 300 and 310 are in phase (i.e., synchronized). When the first and second clocks are synchronized, the second PLL may generate and transmit a phase synchronization acknowledgment signal to the phase detector and sequencer 170.

FIG. 3 and the preceding paragraphs describe the timing sequence of the phase detector and sequencer 170 and the second PLL 145 of the second die 20 synchronizing the first and second clock signal received by the phase detector and sequencer. The timing sequence diagram and description may also represent and describe the timing sequence of the phase detector and sequence 70 and the first PLL 45 of the first die 15 synchronizing the first and second clock signal received by the phase detector and sequencer 70.

Figure 4:
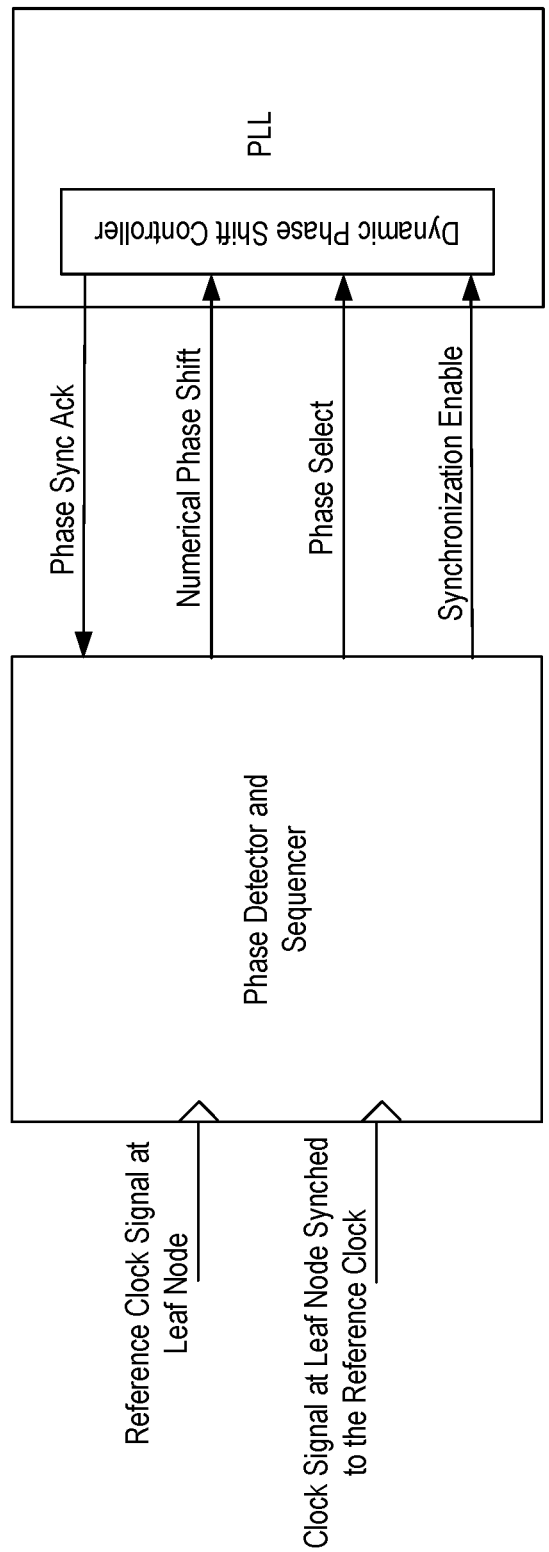
FIG. 4 illustrates the interconnection between a phase detector and sequencer and PLL of one of the dies, in an embodiment.

FIG. 4 illustrates the interconnections between a phase detector and sequencer and a PLL of the same die. FIG. 4 may illustrate the interconnections between the phase detector and sequencer 70 and the first PLL 45 of the first die 15 or may illustrate the interconnections between the phase detector and sequencer 170 and the second PLL 145 of the second die 20.

The interconnections may include a first interconnection that is adapted to transmit the phase synchronization acknowledgment from the PLL to the phase detector and sequencer. The phase synchronization acknowledgment signal is described above with respect to FIG. 3.

The interconnections may include a second interconnection that is adapted to transmit the phase difference signal from the phase detector and sequencer to the PLL. The phase difference signal may include numerical information for the phase difference.

The interconnections may include a third interconnection that is adapted to transmit a phase select signal from the phase detector and sequencer to the PLL. The PLL may include a number of clock output lines. In the example of FIG. 1, both the first and second PLLs have two clock output lines. For example, the first PLL has two clock output lines 45*a* and 45*b* and the second PLL has two clock output lines 145*a* and 145*b*. In other embodiments, each PLL includes more than two clock output lines, such as 3, 4, 5, 6, 7, 8, 9, 10, or more clock output lines. The phase select signal includes information that indicates the particular clock output lines from which a phase shifted clock signal is to be transmitted. For example, the phase select signal may signal to the PLL to output a phase shifted clock signal on the 4, 8, and 9 clock output lines, but not to output a phase shifted clock signal on the 1, 2, 3, 5, 6, and 7 clock output lines. In an alternative example, the phase select signal may signal to the PLL to output a phase shifted clock signal on the 1, 2, 3, 4, and 8 clock output lines, but not to output a phase shifted clock signal on the 5, 6, 7, and 9 clock output lines. Generally, the phase select signal may include information to output a phase shifted clock signal on one or more clock output lines in any combination.

The interconnections may include a fourth interconnection that is adapted to transmit the synchronization enable signal from the phase detector and sequencer to the PLL. The synchronization enable signal is described above with respect to FIG. 2.

Figure 5:
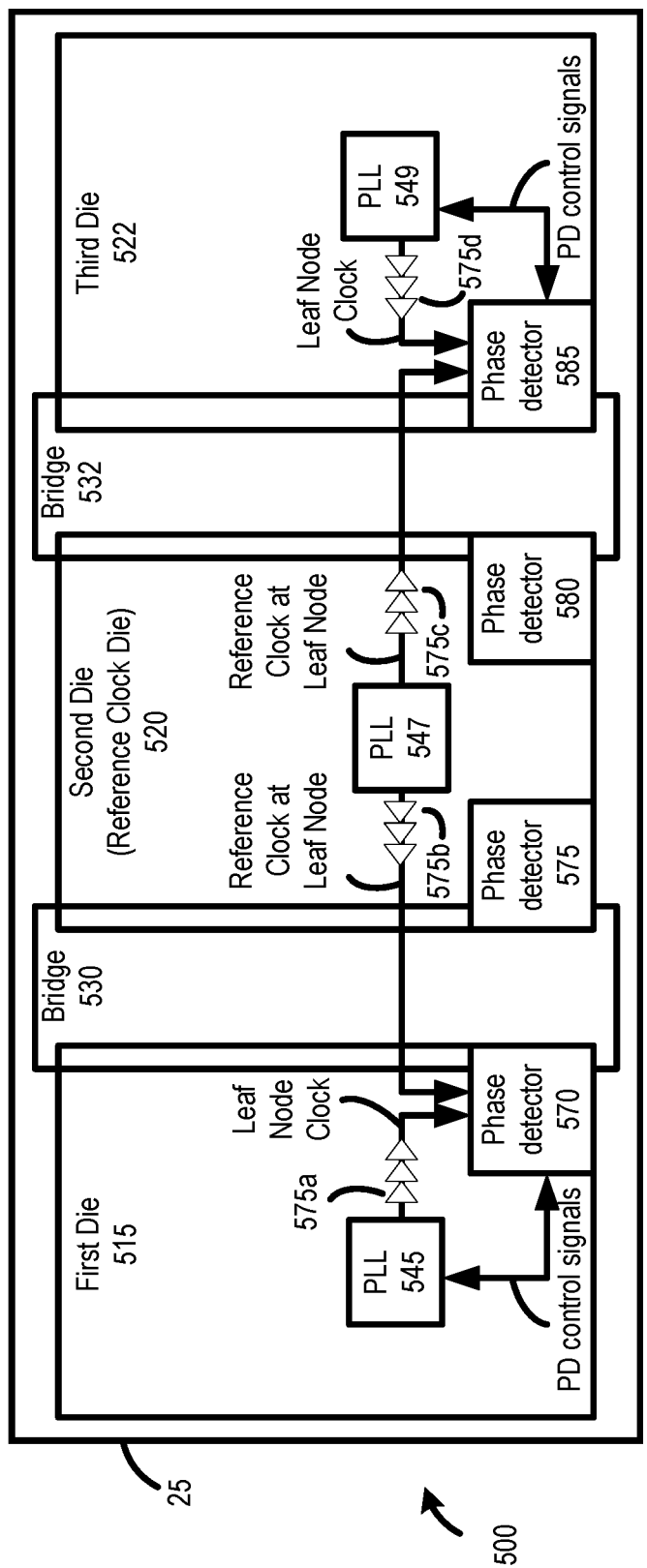
FIG. 5 illustrates a semiconductor device having at least three dies, in an embodiment.

FIG. 5 illustrates a semiconductor device 500, in an embodiment. Semiconductor device 500 is similar to semiconductor device 10 described above but differs in that semiconductor device 500 includes three integrated circuit dies in which the clock signals are synchronized. Semiconductor device 500 may be a SiP device.

Semiconductor device 500 includes a first die 515, a second die 520, and a third die 522 mounted on a package substrate 25. Semiconductor device 500 includes a first bridge 530 that interconnects the IO elements of the first and second dies 515 and 520. Semiconductor device 500 includes a second bridge 532 that interconnects the IO elements of the second and third dies 520 and 522.

The first, second, and third dies may be any combination of the types of dies described above, such as configurable logic dies. The configurable logic dies may be FPGAs, CPLD, or other types of configurable logic dies described above. The first, second, and third dies may have different processing characteristics (e.g., from different processing corners) and as a result have different timing characteristics.

Each of the dies may include a number of clock tree buffers (e.g., clock buffers 575a, 575b, 575c, and 575d) that implement a number of clock tree schemes in the dies. The clock tree buffers and clock trees may be similar to the clock tree buffers and clock trees described above. The clock tree buffers adjust the phase of the clock signals in the dies according to the clock tree schemes so that the dies are clocked according to the particular timing characteristics of the dies.

The interconnect bridges may be any of the types of bridges described above (e.g., EMIBs) in any combination. The package substrate 25 may be any of the types of substrates described above, such as FR4.

The first and third dies 515 and 522 may be the same or similar to dies 15 and 20 described above. The second die 520 may be similar to dies 15 and 20 described above, but may include two phase detector and sequencers 575 and 580.

In an embodiment, a phase detector and sequencer 570 of the first die 515 is connected to a clock output of a PLL 545 of the first die and is connected to a clock output of a PLL 547 of the second die 520. A phase detector and sequencer 585 of the third die 522 is connected to a clock output of a PLL 549 of the third die 522 and is connected to a clock output of the PLL 547 of the second die.

The phase detector and sequencer 570 is adapted to receive the leaf node clock signals of the first die 515 that are generated by the PLL 545. The phase detector and sequencer 570 is also adapted to receive the leaf node clock signals (e.g., reference clock signals) of the second die 520 that are generated by the PLL 547.

Phase detector and sequencer 570 is adapted to detect the phase difference between the leaf node clock signals generated by PLL 545 and leaf node clock signals generated by PLL 547. The phase detector and sequencer 570 is adapted to generate and transmit a first phase difference signal to PLL 545. PLL 545 is adapted to use the first phase difference signal to synchronize the leaf node clock signals of the first die 515 to the leaf node clock signals of the second die 520. That is, PLL 545 is adapted to adjust the clock edges of the leaf node clock signals of the first die to align with the clock edges of the leaf node clock signals (e.g., reference clock signals) of the second die.

The phase detector and sequencer 585 is adapted to receive the leaf node clock signals of the third die 522 that are generated by the PLL 549. The phase detector and sequencer 585 is also adapted to receive the leaf node clock signals of the second die 520 that are generated by the PLL 547.

Phase detector and sequencer 585 is adapted to detect the phase difference between the leaf node clock signals generated by PLL 547 and leaf node clock signals generated by PLL 549. The phase detector and sequencer 585 is adapted to generate and transmit a second phase difference signal to PLL 549. PLL 549 is adapted to use the second phase difference signal to synchronize the leaf node clock signals of the third die 515 to the leaf node clock signals of the second die 520. That is, PLL 549 is adapted to adjust the clock edges of the leaf node clock signals of the third die to align with the clock edges of the leaf node clock signals (e.g., reference clock signals) of the second die.

In an embodiment, the leaf node clock signals of the first and third dies are synchronized to the leaf node clock signals of the second die simultaneously (e.g., in parallel) or at different times (e.g., asynchronously). The clock signals to which one or more other clock signals are synchronized to are sometimes referred to as the reference clock signals and the die generating the clock signals to which one or more other clock signals are synchronized to are sometimes referred to as the reference clock die.

Subsequent to clock synchronization of the leaf node clock signals of the first die, the third die, or both to the leaf node clock signals of the second die, the first die, third die, or both may use the synchronized clock signals to clock data to the second die. The second die may use the clock signals generated by PLL 547 to clock the data into the second die. The first, second, and third dies include transmitters and receivers (e.g., d flip flops) such as those described above for clocking data out from the dies and clocking data into the dies. The control signals described above with respect to FIGS. 2 and 3, for example, may be generated and used by the first, second, and third dies to initiate synchronization, acknowledge synchronization, and for other purposes.

In an embodiment, phase detector and sequencer 575 aligns the leaf node clock signals generated by the PLL 547 of the second die 520 to the leaf node clock signals generated by the PLL 545 of the first die 515. Thereby, data may be transmitted (i.e., clocked) from the second die to the first die using the synchronized leaf node clock signals generated by the PLL 547.

In another embodiment, phase detector and sequencer 580 aligns the leaf node clock signals generated by the PLL 547 of the second die 520 to the leaf node clock signals generated by the PLL 549 of the third die 522. Thereby, data may be transmitted (i.e., clocked) from the second die to the third die using the synchronized leaf node clock signals generated by the PLL 547 of the second die.

Figure 6:
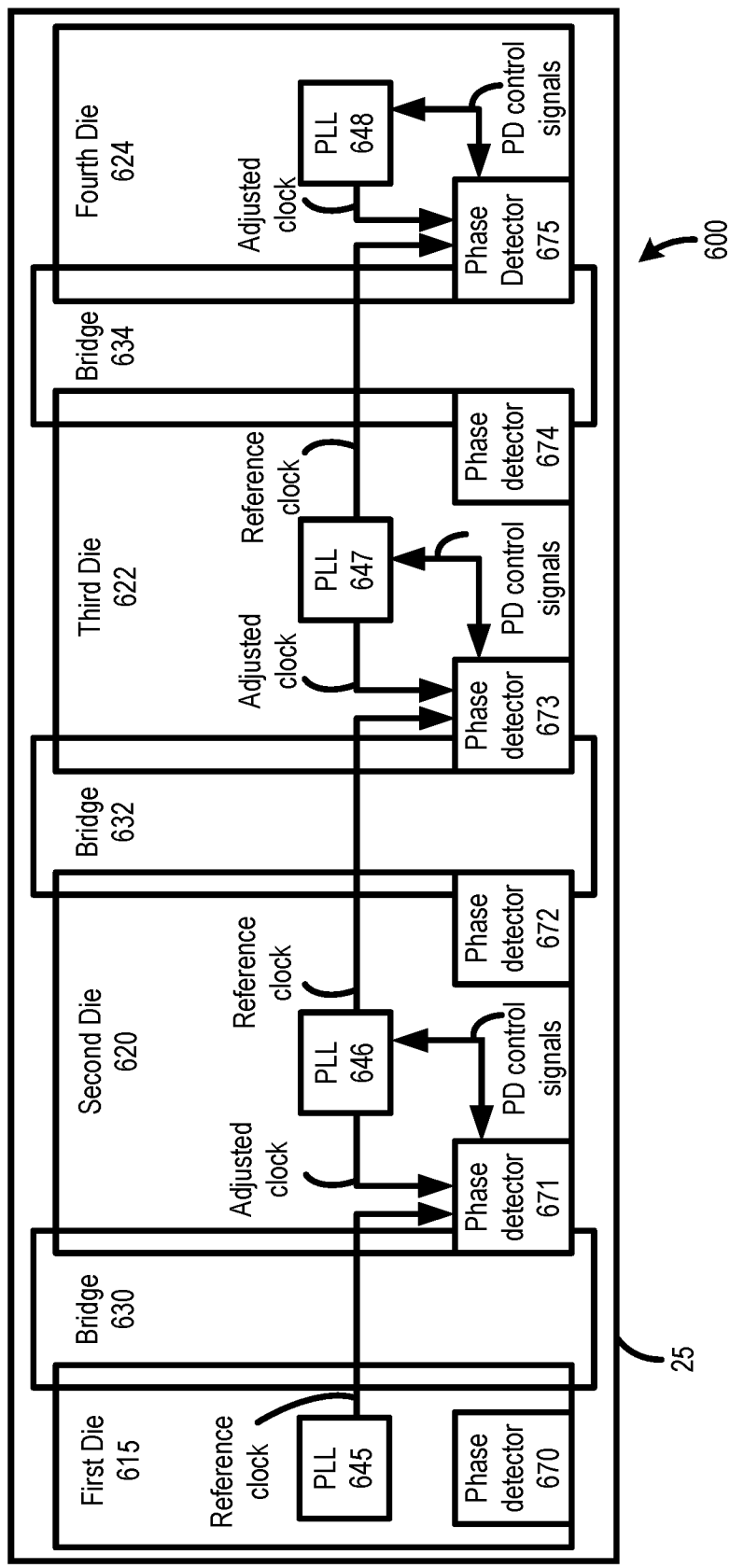
FIG. 6 illustrates a semiconductor device having at least four dies, in an embodiment.

FIG. 6 illustrates a semiconductor device 600, in an embodiment. Semiconductor device 600 is similar to semiconductor devices 10 and 500 described above but differs in that semiconductor device 600 includes four integrated circuit dies in which the clock signals are synchronized. Semiconductor device 600 may be a SiP device.

Semiconductor device 600 includes a first die 615, a second die 620, a third die 622, and a fourth die 624. The dies may be mounted on a package substrate 25. Semiconductor device 600 includes a first bridge 630, a second bridge 632, and a third bridge 634. The first bridge 630 interconnects the IO elements of the first and second dies 615 and 620. The second bridge 632 interconnects the IO elements of the second and third dies 620 and 622. The third bridge 634 interconnects the IO elements of the third and fourth dies 622 and 624.

The first, second, third, and fourth dies may be any combination of the types of dies described above, such as configurable logic dies. The configurable logic dies may be FPGAs, CPLD, or other types of configurable logic dies described above. The first, second, third, and fourth dies may have different processing characteristics (e.g., from different processing corners) and as a result have different timing characteristics. The different timing characteristics may include the dies operating at different frequencies or different phases.

The interconnect bridges may be any of the types of bridges described above (e.g., EMIBs) in any combination. The package substrate 25 may be any of the types of substrates described above, such as FR4.

The first and fourth dies 615 and 624 may be the same or similar to dies 15 and 20 described above. The second die 620 may be similar to dies 15 and 20 described above, but may include two phase detector and sequencers 671 and 672. The third die 622 may be similar to dies 15 and 20 described above, but may include two phase detector and sequencers 673 and 674.

In an embodiment, a phase detector and sequencer 671 of the second die 620 is connected to a clock output of a PLL 645 of the first die 615 and is connected to a clock output of a PLL 646 of the second die 620. A phase detector and sequencer 673 of the third die 622 is connected to a clock output of the PLL 646 of the second die 620 and is connected to a clock output of a PLL 647 of the third die 622. A phase detector and sequencer 675 of the fourth die 624 is connected to a clock output of the PLL 647 of the third die 622 and is connected to a clock output of a PLL 648 of the fourth die 624. Each die may include a number of clock tree buffers (not shown) that may be positioned between the PLL output and the phase detector inputs, such as shown in FIGS. 1 and 5 and as described above.

The phase detector and sequencer 671 is adapted to receive the leaf node clock signals of the first die 615 that are generated by the PLL 645. The phase detector and sequencer 671 is also adapted to receive the leaf node clock signals of the second die 620 that are generated by the PLL 646. Phase detector and sequencer 671 is adapted to determine the phase difference between the leaf node clock signals generated by PLL 645 and leaf node clock signals generated by PLL 646. The phase detector and sequencer 671 is adapted to generate and transmit a first phase difference signal to PLL 646. PLL 646 is adapted to use the first phase difference signal to synchronize the leaf node clock signals of the second die 620 to the leaf node clock signals of the first die 615. That is, PLL 646 is adapted to adjust the clock edges of the leaf node clock signals of the second die to align with the clock edges of the leaf node clock signals (e.g., reference clock signals) of the first die. The clock edges of the first die may not be adjusted.

The phase detector and sequencer 673 of the third die 622 is adapted to receive the leaf node clock signals generated by PLL 646 of the second die 620. The leaf node clock signals generated by PLL 646 remain synchronized to the leaf node clock signals generated by PLL 645 at the time when the phase detector and sequencer 673 receives the leaf node clock signals generated by PLL 646.

Phase detector and sequencer 673 is adapted to determine the phase difference between the leaf node clock signals generated by PLL 646 and leaf node clock signals generated by PLL 647. At the time when the phase detector and sequencer 673 receives the leaf node clock signals generated by PLLs 646 and 647, the leaf node clock signals generated by PLLs 465 and 646 are synchronized.

The phase detector and sequencer 673 is adapted to generate and transmit a second phase difference signal to PLL 647. PLL 647 is adapted to use the second phase difference signal to synchronize the leaf node clock signals generated by PLL 647 to the leaf node clock signals of PLL 646. That is, PLL 647 is adapted to adjust the clock edges of the leaf node clock signals of the third die to align with the clock edges of the leaf node clock signals (e.g., reference clock signals) of the second die. At the time when the leaf node clock signals generated by the second and third PLLs are synchronized by the third PLL 647, the leaf node clock signals generated by the first, second, and third PLLs are synchronized.

The phase detector and sequencer 675 is adapted to receive the leaf node clock signals generated by PLL 647 of the third die 622. At the time when the phase detector and sequencer 675 receives the leaf node clock signals generated by PLLs 647 and 648, the leaf node clock signals generated by PLLs 645, 646, and 647 are synchronized.

Phase detector and sequencer 675 is adapted to determine the phase difference between the leaf node clock signals generated by PLL 647 and leaf node clock signals generated by PLL 648. The phase detector and sequencer 675 is adapted to generate and transmit a third phase difference signal to PLL 648. PLL 648 is adapted to use the third phase difference signal to synchronize the leaf node clock signals generated by PLL 648 to the leaf node clock signals of PLL 647. That is, PLL 648 is adapted to adjust the clock edges of the leaf node clock signals of the fourth die to align with the clock edges of the leaf node clock signals (e.g., reference clock signals) of the third die. At the time when the leaf node clock signals generated by the third and fourth PLLs are synchronized by the fourth PLL 648, the leaf node clock signals generated by the first, second, third, and fourth PLLs are synchronized.

That is, the second die uses the leaf node clock signals of the first die as reference clock signals to adjust the leaf node clock signals of the second die. Thereafter, the third die uses the leaf node clock signals of the second die as reference clock signals to adjust the leaf node clock signals of the third die. And thereafter, the fourth die uses the leaf node clock signals of the third die as reference clock signals to adjust the leaf node clock signals of the fourth die.

Thereby, the leaf node clock signals of the first, second, third, and fourth dies are sequentially synchronized and are simultaneously synchronized with each other. Using the synchronized clock signals, data may be clocked data from the first die to the second die, from the second die to the third die, and from the third die to the fourth die. Each die uses the synchronized leaf node clock signals for clocking the transmitters and receivers of the dies for transmission of data from one die to the next.

In an embodiment, the leaf node clock signals of three dies are sequentially synchronized for data transfer between the dies. In another embodiment, the leaf node clock signals of five or more dies are sequentially synchronized for data transfer between the dies.

A number of benefits are facilitated by the described embodiments. For example, dies that are tested and qualify (i.e., bin out) as relatively high-speed parts and dies that are tested and qualify as slower speeds parts may be combined in a single SiP. The cost of the SiP may be lower than a SiP with two relatively high-speed parts because high-speed parts are typically sold for larger amounts than lower speed parts. Thereby SiPs having different price points may be offered to a variety of budgets and a variety of applications. Additionally, for relatively large dies, such as relatively large FPGA dies, the process parameters may drift for dies on a single wafer or across a number of wafers resulting in dies that have different timing characteristics. The described synchronization embodiments allow for this diversity of dies to be combined into a single SiP.

Additionally, dies of different processing generations may be combined into a single SiP. Dies of different processing generations may have different timing characteristics and the described synchronization embodiments allow for these dies to be combined into a single SiP.

Figure 7:
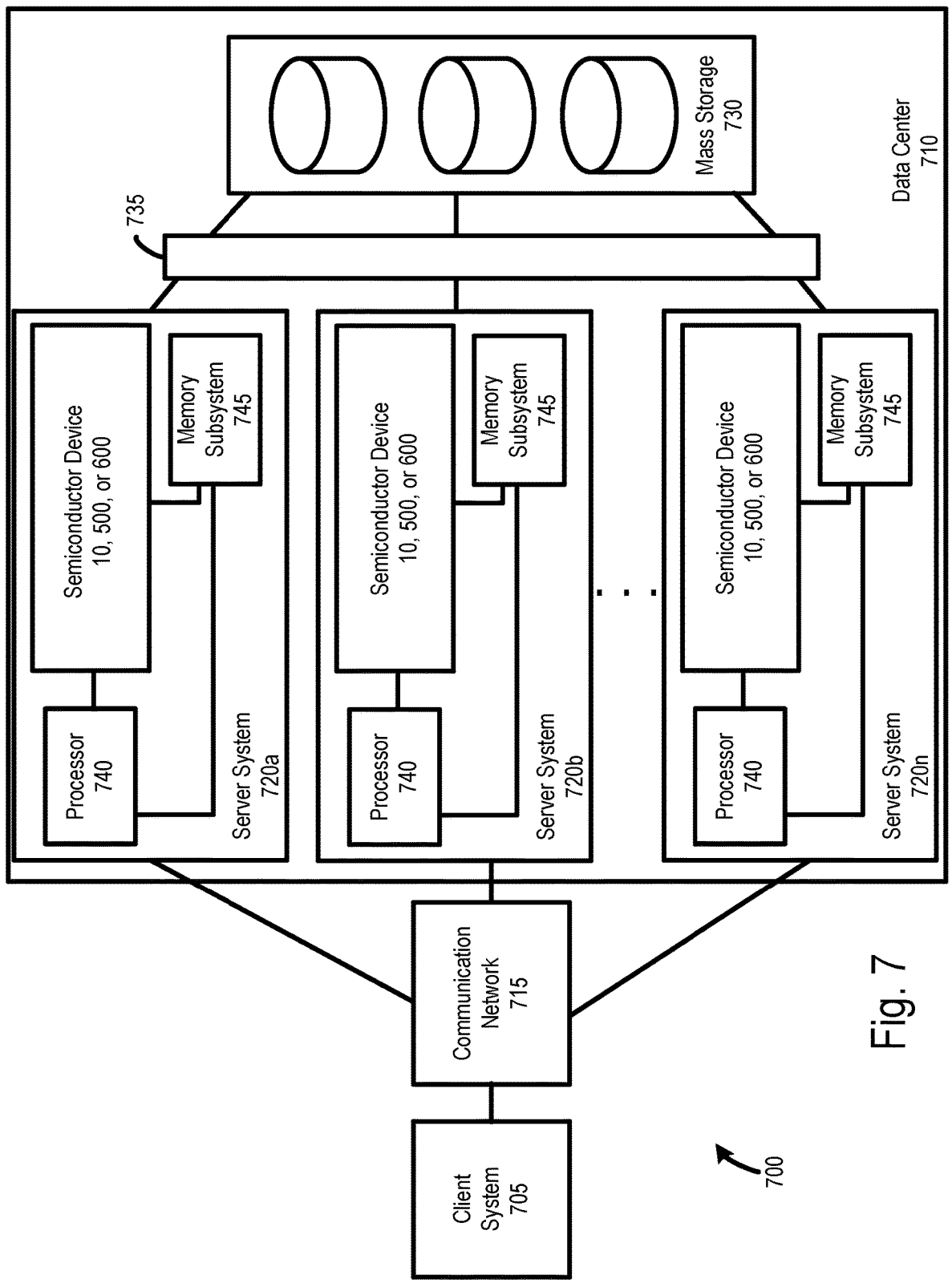
FIG. 7 illustrates a data system, in an embodiment.

FIG. 7 illustrates a data system 700, in an embodiment. Data system 700 includes a client system 705 that is adapted to access a data center 710 using a communication network 715. The client system 705 may include one or more client computers that are adapted to access data stored in the data center. The client system may include a server, a desktop computer, a laptop computer, a mobile device (e.g., a tablet computer, a smartphone, or other devices), any combination of these devices, or other devices. The client system may transfer data to the data center for storage in the data center, retrieve data from the data center, or request alteration of data in the data center. Communication network 715 may include one or more networks, such as the Internet, one or more intranets, or other network systems.

Data center 710 includes one or more servers, such as servers 720a, 720b ... 720n, mass storage 730, an IP switch 735, and may include other elements. Mass storage 730 includes one or more types of memory devices, such as a disk array that includes a number of disk memory devices (e.g., magnetic disk memory), optical storage (e.g., optical disk storage), solid state memory, tape memory, and others. The memory devices may be located in one or more data center racks, which include one or more of the servers, the IP switch, both, or do not include the servers and the IP switch. The IP switch routes communication packets between the servers and the memory devices of the mass storage.

Each server includes one or more processors 740, one or more semiconductor devices 10, 500, and 600 (described above), a memory subsystem 745, and other devices. In each server, a first processor 740 included in the server may communicate with a second processor 740 in the server using a bus structure and a bus communication standard, such as the UltraPath Interconnect (UPI) standard for point-to-point processor interconnect or may use a different communication standard. The processor and semiconductor device of a server may communicate using a bus structure and a bus communication standard, such as the peripheral component interconnect express (PCIe) standard. The processor, semiconductor device, or both may communicate with the memory subsystem at a single data rate (SDR), double data rate (DDR), or quad data rate (QDR) in half or full duplex mode. The memory subsystem may include DDR non-volatile memory, 3D xPoint non-volatile memory, or other types of memory.

Each semiconductor device (e.g., semiconductor device 10, 500, or 600 described above) may be located on a PCB (e.g., a PCI card) where the PCB is configured to be inserted and held in a PCI or PCIe slot of a server. In some embodiments, one or more servers include a number of semiconductor devices 10, 500, or 600, which may be positioned a number of PCB cards that are located in a server's PCI or PCIe slots.

In each server, the processor, semiconductor device, and memory subsystem are located on a single sled in a data center rack, are distributed among two or more sleds in a data center rack, or are distributed among a number of sleds in a number of data center racks. That is, each server is a consolidated server (e.g., components in a single sled and in a single data center rack) or a distributed server (e.g., components in multiple sleds in a single data center rack, or components in multiple sleds and in multiple data center racks). Distributing components of a server among sleds, data center racks, or both may facilitate relatively fast communication between the components by positioning select components in frequent communication relatively close to each other. For example, in a server where the processor accesses the memory subsystem more frequency than the semiconductor device, the processor and memory subsystem may be located relatively close (e.g., on a first sled) in a data center rack and the semiconductor device may be located farther from the memory subsystem (e.g., on a different second sled) in the data center rack. Alternatively, the second sled may be positioned nearer the mass storage than the first sled, for example, if the semiconductor device accesses the mass storage with a higher frequency than the processor.

In an embodiment, the memory subsystems of a number of servers may be located on a single sled (e.g., a sled that is located at about the center of a data center rack) and the processors and semiconductor devices may be located on one or more different sleds located above and below the center sled. Such configuration may facilitate relatively fast access to the memory subsystem particularly if the memory subsystems are accessed by multiple servers.

In the data center, an FPGA of the semiconductor device in combination with one or more other devices (e.g., another FPGA, an ASIC, a processor, or another device) on the semiconductor device facilitate the acceleration one or more functions that may be offloaded from a processor 740 to the FPGA. For example, the FPGA operating as an accelerator may be configured to perform massively parallel, real-time processing functions that may be offloaded from the processor to the FPGA and performed faster than the processor. Example massively parallel, real-time processing functions include massively parallel, real-time data checking, data conversion, data processing, video processing, frame grabbing, image enhancement of grabbed frames, erosion filtering, dilation filtering, encryption, decryption, data extraction from a long word, or other functions performed on relatively small portions of data that can be operated on in parallel at higher rates of operation compared to the processor.

A number of benefits are provided in the data center due to the inclusion of SiPs and dies according to various described embodiments. For example, dies from different processing corners that have different timing characteristics may be included in a SiP due to the use of the relatively simple clock synchronization circuitry described herein. Such synchronization may be achieved without the inclusion of large-footprint cross-clock FIFO (first in, first out) registers and synchronizers. Additionally, because dies having different timing characteristics and different price points may be included in a SiP, SiPs having a variety of price points may be offered. Specifically, low speed and low cost dies may be mixed with higher speed and higher costs dies in a SiP where the different timing characteristics of the dies do not inhibit their inclusion in a SiP due to the embodiments described herein. Varying price points may be offered due to the variety of costs of low costs dies and the variety of costs of higher costs dies and the selective combination of low cost and higher costs in SiPs.

Figure 8:
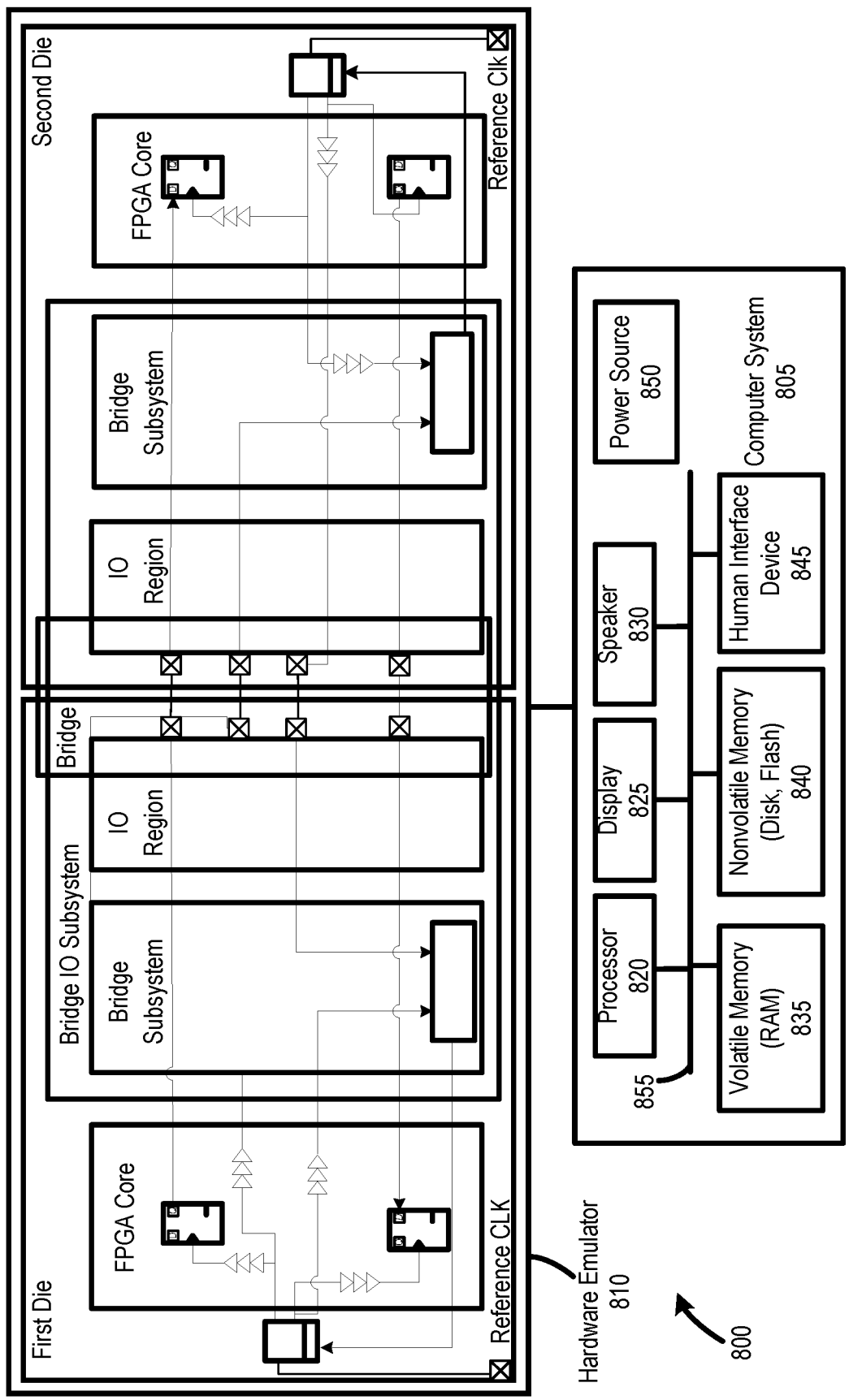
FIG. 8 illustrates an emulation system, in an embodiment.

FIG. 8 illustrates an emulation system 800 that includes a computer system 805 and a hardware emulator 810, which may include one or more semiconductor devices, such as devices 10, 500, or 600 in any combination. The hardware emulator is an emulator that takes the form of a hardware device that emulates another device. The hardware emulator, for example, may emulate an electronic device, such as a printer, a scanner, a camera, a one or more types of processors, a computer, a game console, a tablet computer, a smartphone, a television, a medical device, an electronic system of a vehicle (e.g., car, airplane, motorcycle, or others), a home appliance, a meter, such as a gas meter, a router, or other devices.

The computer system 805 may be a personal computer, a laptop computer, a server, a tablet computer, a custom computer system, such as a custom computer system adapted for testing the emulator, or other computer types. The computer system may include a processor 820, a display 825, a speaker 830, a volatile memory 835, a nonvolatile memory 840, a human interface device 845, a power source 850, one or more busses 855 that link the components, any combination of these components, or other additional components. The computer system may link to the hardware emulator via a wired or a wireless communication link. The wired communication link may include, for example, one or more of USB, Ethernet, serial RS-232, parallel DB25, eSATA, displayport, HDMI, an optical link, PCI, PCIe, or others. The wireless communication link may include, for example, one or more of an RF link (e.g., Bluetooth, Wi-Fi, or others), an IR link, or others.

The hardware emulator may include one or more configurable ICs, such as FPGAs 870a, 870b, 870c, and 870d, one or more transceivers (i.e., XCVRs), such as transceivers 875a, 875b, 875c, and 875d, and one or more general interface bridges (i.e., GIBs) or other bridge types (e.g., EMIBs). The FPGAs and transceivers may be communicatively linked by the bridges. The hardware emulator may include other circuits, such as a processor, memory, a network interface device, a USB hub and port, a PCIe connector, a complex programmable logic device (CPLD), an ASIC, or any combination of these devices. The circuits (e.g., FPGA, ASIC, processor, or others described above) of the hardware emulator may form a portion of the circuits of one or more of the semiconductor devices 10, 500, or 600 described above. The circuits of the hardware emulator (e.g., FPGAs or other circuits) may be configured to operate either in a peer-to-peer mode or a master-slave mode as described above. For example, two or more FPGAs may operate in a peer-to-peer mode and other FPGAs may operate in a master-slave mode, for example, if the FPGAs are different types or are from different processing generations.

One or more of the FPGAs are configurable for emulating one or more devices, such as the emulated devices listed above. The FPGAs may be configured to emulate a device using a hardware description language, such as HDL, to configure the logic array block of the FPGA.

A variety of benefits are provided in hardware emulators due to FPGAs of different processing corners being included in SiP devices in the emulators. The benefits provided are similar to those described above with respect to the data center benefits.

In an embodiment, a semiconductor device includes a first configurable IC that is operable at a first clock phase. The first IC includes a first IO element and a second IO element. The first configurable IC includes a first PLL. The PLL includes a first control circuit, a first clock input to receive a first clock signal, a first clock output to output a second clock signal, and a first phase detector. The first phase detector is configured to generate a first phase difference signal for a phase difference between the first and second clock signals.

The first configurable IC includes a second phase detector that is connected to the first clock output of the first PLL to receive the second clock signal. The second phase detector is also connected to the first IO element to receive a third clock single from a second configurable IC. The second phase detector is also connected to an input of the first control circuit. The second configurable IC is operable at a second clock phase that is out of phase with the first clock phase. The second phase detector is configured to generate a second phase difference signal for a phase difference between the second and third clock signals.

The first control circuit is configured to control the first PLL to use the first phase difference signal to generate the second clock signal or use the second phase difference signal to generate the second clock signal. If the first PLL device uses the first phase difference signal to generate the second clock signal, then the second clock signal is a synthesized clock signal that is synthesized using the first clock signal. The first clock signal may be a crystal clock signal. If the first PLL device uses the second phase difference signal to generate the second clock signal, then the second clock signal is synchronized with the third clock signal.

The first configurable IC includes a first transmitter that is connected between a second clock output of the first PLL device and the second IO element. If the second clock signal is synchronized with the third clock signal by the first PLL device using the second phase difference signal, then the first transmitter is configured to use the second clock signal to clock the first transmitter to transmit data through the second IO element to the second configurable IC.

The semiconductor device may include a first clock buffer connected between the first clock output of the first PLL device and the second phase detector. The semiconductor device may include a second clock buffer connected between the first transmitter and the second clock output of the first PLL device. The first and second clock buffers compose at least a portion of a clock tree and outputs of the first and second clock buffers are leaf nodes of the clock tree. The first clock buffer and the second clock buffer form different clock domains in the first IC.

The first PLL device may include a filter that is connected to the first phase detector and a controlled oscillator that is connected to the filter. The controlled oscillator is configured to generate the second clock signal, and the first control circuit is configured to transfer either the first phase difference signal to the filter or transfer the second phase difference signal to the filter.

The first and second outputs of the first PLL may be the same output. The second and third clock may be the same frequency.

The semiconductor device may further include the second configurable IC. The second configurable IC may include a third IO element and a fourth IO element. The second configurable IC may include a second PLL device. The second PLL may include a second control circuit, a second clock input to receive the first clock signal, a third clock output to output the third clock signal, and a third phase detector. The third phase detector may generate a third phase difference signal for a phase difference between the first and third clock signals.

The second configurable IC may include a fourth phase detector. The fourth phase detector may be connected to the third clock output of the second PLL device to receive the third clock signal. The fourth phase detector may be connected to the third IO element to receive the second clock single from the first configurable IC. The fourth configurable IC may be connected to an input of the second control circuit. The second configurable IC is operable at the second clock phase and the fourth phase detector is configured to generate a fourth phase difference signal for a phase difference between the second and third clock signals.

The second control circuit is configured to control the second PLL device to use the third phase difference signal to generate the third clock signal or use the fourth phase difference signal to generate the third clock signal. If the second PLL device uses the third phase difference signal to generate the third clock signal, then the third clock signal is a synthesized clock signal that is synthesized using the first clock signal (e.g., the crystal clock signal). If the second PLL device uses the fourth phase difference signal to generate the third clock signal, then the third clock signal is synchronized with the second clock signal.

The second configured IC may include a second transmitter that is connected between a fourth clock output of the second PLL device and the fourth IO element. If the third clock signal is synchronized with the second clock signal by the second PLL device using the fourth phase difference signal, then the second transmitter is configured to use the third clock signal to clock the second transmitter to transmit data through the fourth IO element to the first configurable IC.

The semiconductor device may include an interconnect bridge that connects the first IO element to the third IO element and connects the second IO element to the fourth IO element. The interconnect bridge may be an EMIB element.

The first configurable IC may be a first field programmable gate array (FPGA) and the second configurable IC may be a second FPGA. The first and second FPGAs operate at different clock phases based on different processing characteristics of the first and second FPGAs.

Figure 9:
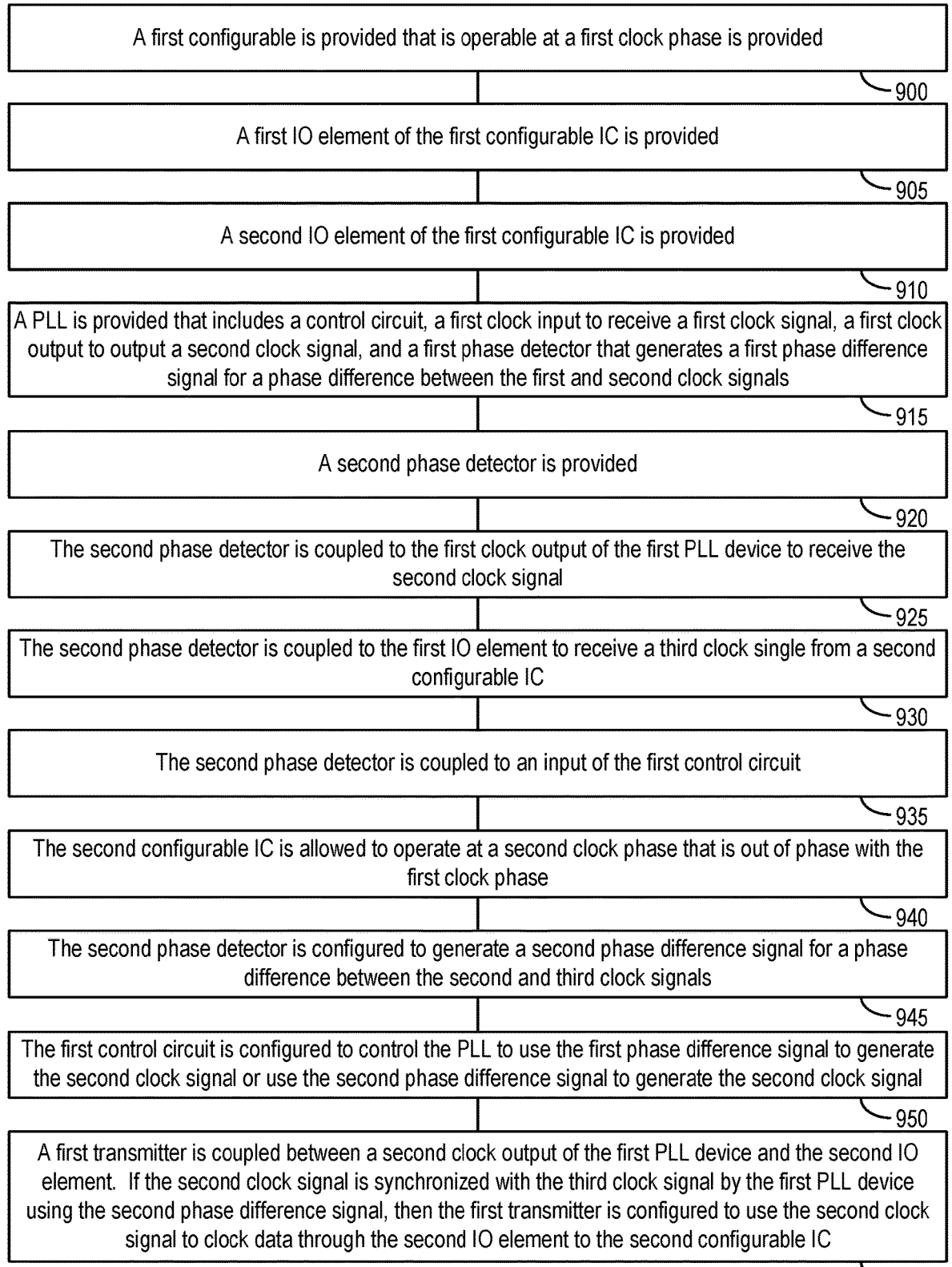
FIG. 9 is a flow diagram for a clock synchronization method, in an embodiment.

FIG. 9 is a flow diagram for a clock synchronization method, in an embodiment. Elements may be added to the flow diagram, removed from the flow diagram, or combined without deviating from the scope and purview of the method.

At 900, a first configurable IC is provided that is operable at a first clock phase.

At 905, a first IO element of the first configurable IC is provided.

At 910, a second IO of the first configurable IC is provided.

At 915, a PLL of the first configurable IC is provided. The first PLL includes a first control circuit, a first clock input to receive a first clock signal, a first clock output to output a second clock signal, and a first phase detector. The first phase detector is configured to generate a first phase difference signal for a phase difference between the first and second clock signals.

At 920, a second phase detector of the first configurable IC is provided.

At 925, the second phase detector is coupled to the first clock output of the first PLL device to receive the second clock signal.

At 930, the second phase detector is coupled to the first IO element to receive a third clock single from a second configurable IC.

At 935, the second phase detector is coupled to an input of the first control circuit.

At 940, the second configurable IC is allowed to operate at a second clock phase that is out of phase with the first clock phase.

At 945, the second phase detector is configured to generate a second phase difference signal for a phase difference between the second and third clock signals.

At 950, the first control circuit is configured to control the first PLL device to use the first phase difference signal to generate the second clock signal or use the second phase difference signal to generate the second clock signal.

At 955, a first transmitter is coupled between a second clock output of the first PLL device and the second IO element. If the second clock signal is synchronized with the third clock signal by the first PLL device using the second phase difference signal, then the first transmitter is configured to use the second clock signal to clock data through the second IO element to the second configurable IC.

The method may include configuring the first transmitter to operate in a first clock domain of the first configurable IC and configuring the first phase detector to operate in a second clock domain of the first configurable IC.

The method may include configuring providing a first clock buffer between the second clock output and the first transmitter to establish the first clock domain and providing a second clock buffer between the first clock output and the first phase detector to establish the second clock domain.

Clock signals that are output of the first and second clock buffers are leaf node clock signals. If the first PLL device uses the first phase difference signal to generate the second clock signal, then the second clock signal is a synthesized clock signal that is synthesized using the first clock signal. If the first PLL device uses second phase difference signal to generate the second clock signal, then the second clock signal is synchronized with the third clock signal.

The method may include providing the second configurable IC, providing an interconnect bridge linking the first and second configurable ICs, and configuring the second configurable IC to generate and transmit the third clock signal to the second phase detector through the interconnect bridge.

In an embodiment, a semiconductor device includes a first configurable IC that is configured to operate at a first clock phase. The first configurable IC includes a first PLL that includes a first clock output to output a first clock signal having the first phase. The semiconductor device includes a second configurable IC that is configured to operate at a second clock phase that is different from the first clock phase.

The second configurable IC includes a first phase detector and a second PLL. The second PLL includes a second clock output to output a second clock signal having the second phase. The first phase detector is configured to receive the first and second clock signals and generate a first phase difference signal for a phase difference between the first and second clock signals. The second PLL is configured to receive the first phase difference signal to synchronize the first and second clock signals using the first phase difference signal.

The semiconductor device may include a third configurable IC that is configured to operate at a third clock phase that is different from the first and second clock phases. The third configurable IC includes a second phase detector and a third PLL. The third PLL includes a third clock output to output a third clock signal having the third phase. The second phase detector is configured to receive the second and third clock signals and generate a second phase difference signal for a phase difference between the second and third clock signals. While the first and second clock signals are synchronized, the third PLL is configured to receive the second phase difference signal to synchronize the second and third clock signals using the second phase difference signal.

The semiconductor device may include a fourth configurable IC that is configured to operate at a fourth clock phase that is different from the first, second, and third clock phases. The fourth configurable IC may include a third phase detector and a fourth PLL. The fourth PLL may include a fourth clock output to output a fourth clock signal having the fourth phase. The third phase detector is configured to receive the third and fourth clock signals and generate a third phase difference signal for a phase difference between the third and fourth clock signals. While the first, second, and third clock signals are synchronized, the fourth PLL is configured to receive the third phase difference signal to synchronize the third and fourth clock signals using the third phase difference signal.

The semiconductor device may include a first interconnect bridge that connects a first plurality of IO elements of the first configurable IC and a second plurality of IO elements of the second configurable IC. The semiconductor device may also include a second interconnect bridge that connects a third plurality of IO elements of the second configurable IC and a third plurality of IO elements of the third configurable IC. The interconnect bridges may be EMIB elements embedded in a substrate the that first, second, third, and fourth configurable ICs are coupled to. The semiconductor device may be a SiP device.

This description has been presented for the purposes of illustration and description. It is not intended to be exhaustive or to limit the invention to the precise form described, and many modifications and variations are possible in light of the teaching above. For example, while SiP devices have been described above, embodiments described may be applied to a variety of multi-chip modules, multi-die assemblies, system-on-package devices, and other multi-die devices. Additionally, while various circuits have been described as digital circuits, the circuits may be analog circuits or the circuits may include mixed-signal circuits. The implementations were chosen and described in order to best explain the principles of the embodiments and their practical applications. This description will enable others skilled in the art to best utilize and practice the invention in various implementations and with various modifications as are suited to a particular use. The scope of the invention is defined by the following claims.

The invention claimed is:

1. An integrated circuit comprising:
a clock generator circuit comprising a control circuit and a first phase detector circuit, wherein the clock generator circuit generates a first clock signal, wherein the first phase detector circuit generates a first phase difference signal indicating a phase difference between the first clock signal and a second clock signal; and
a second phase detector circuit that generates a second phase difference signal indicating a phase difference between the first clock signal and a third clock signal that is received from outside the integrated circuit, wherein the control circuit is configurable to cause the clock generator circuit to use the second phase difference signal to synchronize the first clock signal with the third clock signal.

2. The integrated circuit of claim 1, wherein the control circuit is configurable to cause the clock generator circuit to use the first phase difference signal to synthesize the first clock signal based on the second clock signal.

3. The integrated circuit of claim 1 further comprising:
a phase selector to generate a synchronization enable signal, wherein the control circuit is configurable by the synchronization enable signal to cause the clock generator circuit to use the first phase difference signal to synthesize the first clock signal based on the second clock signal or to use the second phase difference signal to synchronize the first clock signal with the third clock signal.

4. The integrated circuit of claim 1 further comprising:
a receiver circuit to clock data received from outside the integrated circuit into the integrated circuit in response to the first clock signal.

5. The integrated circuit of claim 1 further comprising:
a transmitter circuit to use the first clock signal to transmit data outside the integrated circuit if the clock generator circuit synchronizes the first clock signal with the third clock signal using the second phase difference signal.

6. The integrated circuit of claim 1 further comprising:
a clock buffer circuit that transmits the first clock signal from the clock generator circuit to the second phase detector circuit.

7. The integrated circuit of claim 1 further comprising:
an input connector coupled to provide the third clock signal to the second phase detector circuit from outside the integrated circuit.

8. The integrated circuit of claim 5 further comprising:
a clock buffer circuit that transmits the first clock signal to the transmitter circuit.

9. A method for synchronizing first and second clock signals, the method comprising:
generating the first clock signal using a clock generator circuit in an integrated circuit;
generating a first phase difference signal indicating a phase difference between the first clock signal and a third clock signal using a first phase detector circuit in the clock generator circuit;
transmitting the second clock signal from an input connector of the integrated circuit to a second phase detector circuit in the integrated circuit;
generating a second phase difference signal indicating a phase difference between the first clock signal and the second clock signal using the second phase detector circuit; and
configuring the clock generator circuit to use the second phase difference signal to synchronize the first clock signal with the second clock signal.

10. The method of claim 9 further comprising:
configuring the clock generator circuit to use the first phase difference signal to synthesize the first clock signal based on the third clock signal.

11. The method of claim 10 further comprising:
generating a synchronization enable signal with a phase selector that configures the clock generator circuit to use the first phase difference signal to synthesize the first clock signal based on the third clock signal or to use the second phase difference signal to synchronize the first clock signal with the second clock signal.

12. The method of claim 9 further comprising:
providing the first clock signal through a clock buffer to a receiver circuit to clock data received from outside the integrated circuit into the integrated circuit.

13. The method of claim 9 further comprising:
providing the first clock signal through a clock buffer to a transmitter circuit to transmit data outside the integrated circuit.

14. The method of claim 9, wherein configuring the clock generator circuit to use the second phase difference signal to synchronize the first clock signal with the second clock signal further comprises configuring the clock generator circuit to use the second phase difference signal to synchronize the first clock signal with the second clock signal using a control circuit in the clock generator circuit.

15. The method of claim 9, wherein the clock generator circuit is a phase-locked loop circuit.

16. A device comprising:
a first integrated circuit comprising a first clock generator circuit that generates a first clock signal; and
a second integrated circuit comprising a first phase detector circuit and a second clock generator circuit that generates a second clock signal, wherein the first phase detector circuit generates a first phase difference signal indicating a phase difference between the first clock signal and the second clock signal, and wherein the second clock generator circuit synchronizes the second clock signal with the first clock signal based on the first phase difference signal.

17. The device of claim 16, wherein the first integrated circuit further comprises a second phase detector circuit that generates a second phase difference signal indicating a phase difference between a third clock signal generated by the first clock generator circuit and a fourth clock signal generated by the second clock generator circuit.

18. The device of claim 17, wherein the first clock generator circuit synchronizes the third clock signal with the fourth clock signal based on the second phase difference signal.

19. The device of claim 16, wherein the second clock generator circuit comprises a second phase detector circuit that generates a second phase difference signal indicating a phase difference between the second clock signal and a third clock signal, and wherein the second clock generator circuit is configurable to use the second phase difference signal to synthesize the second clock signal with the third clock signal.

20. The device of claim 16, wherein at least one of the first clock generator circuit or the second clock generator circuit is a phase-locked loop circuit.

* * * * *